United States Patent [19]

Rao et al.

[11] Patent Number: 5,063,201

[45] Date of Patent: Nov. 5, 1991

[54] METHOD TO PRODUCE $YBa_2Cu_3O_{6+x}$ SUPERCONDUCTING WIRES OR TAPES

[75] Inventors: A. Srinivasa Rao, Arnold; Om P. Arora, Silver Spring, both of Md.

[73] Assignee: The United States of America as represented by the Secretary of the Navy, Washington, D.C.

[21] Appl. No.: 599,605

[22] Filed: Oct. 18, 1990

[51] Int. Cl.$^5$ .............................................. H01L 39/12
[52] U.S. Cl. ......................................... 505/1; 264/60; 264/66; 505/739; 505/740
[58] Field of Search ....................... 264/56, 60, 61, 65, 264/66, 175, 211, 211.11; 505/1, 704, 725, 739, 740, 742, 786

[56] References Cited

U.S. PATENT DOCUMENTS 4,826,808  5/1989  Yurek et al. ............................. 505/1

FOREIGN PATENT DOCUMENTS 62328879  7/1989  Japan .

OTHER PUBLICATIONS

Seb et al. "Fabrication of Stable Superconductive Wires with $YBa_2Cu_3O_x/Ag_2O$ Composite Core" Appl. Phys. Lett. 54(8) Feb. 89.

Primary Examiner—James Lowe
Assistant Examiner—Christopher A. Fiorilla
Attorney, Agent, or Firm—Luther A. Marsh

[57] ABSTRACT

A method of making an improved $YBa_2Cu_3O_{6+x}$ ceramic superconductor. The method includes the steps of: adding aluminum powder to $YBa_2Cu_3O_{6+x}$ powder to form a powder mixture, pressing the powder mixture, and rolling the pressed mixture into a thin ceramic superconductor. The addition of aluminum results in improved superconducting transition temperature, ductility and formability.

3 Claims, No Drawings

METHOD TO PRODUCE $YBa_2Cu_3O_{6+x}$ SUPERCONDUCTING WIRES OR TAPES

The invention described herein may be manufactured and used by or for the Government of the United States of America for Governmental purposes without the payment of any royalties thereon or therefor.

BACKGROUND OF THE INVENTION

1. Field of the Invention

This invention is directed to a method to extrude fine wires or tapes that will behave as superconductors above 70K.

2. Brief Description of the Prior Art

Traditionally the $YBa_2Cu_3O_{6+x}$ superconductor is made well by known ceramic processing method. This method involves grinding yttrium oxide, barium carbonate and copper oxide. This mixture is calcined between 800°–1050° C. The powders after ball milling and mixing are sintered to compact at temperatures in the range 800°–1050° C. followed by annealing at about 400°–600° C. Although the final ceramic shows a sharp superconducting transition at about 85–90K, these materials are very hard and brittle. As a result, these materials are very difficult for the rolling operation.

This invention yields a reliable superconductor product as set out below, and in particular improves the superconducting transition temperature and also the ductility of the ceramic.

SUMMARY OF THE INVENTION

This invention provides a method for making an improved ceramic superconducting devices comprising:

a) mixing of oxide of yttrium ($Y_2O_3$), copper (CuO) and barium carbonate ($BaCO_3$) in a ratio of about 50 to about 100 gm ($Y_2O_3$), about 105 to about 300 gm (CuO) and about 175 to about 200 gm ($BaCO_3$), b) ball milling the mixture with zirconia balls for one about hour, c) calcining the mixture at a temperature of 940° C. + or −2° C. with a heating sequence of about 5° C./minute.

d) maintaining the mixture at 940° C. for about 300 to about 600 minutes depending upon the amount that is being calcined at a given time, e) cooling the mixture to room temperature at the rate of about 5° C./minute f) grinding the superconducting $YBa_2Cu_3O_{6+x}$ into a fine powder using zirconia balls.

g) heating the powder to about 700° C. at the rate of about 5° C./minute and cooling the mixture to about 550°–600° C. at the rate of about 1° C./minute and annealing the fine powder in flowing oxygen for about 300 minutes and cooling the system at the rate of about 1° to about 2° C./minute, h) adding fine aluminum powder in the ratio of about 60 gms to 40 gms of $YBa_2Cu_3O_{6+x}$ powder and ball milling the mixture for about one hour, i) dry pressing the powder mixture at about 25000 psi, j) heating the powder mixture at from about 375°–400° C. for about 1 hour, k) cooling the powder mixture, and l) rolling the powder mixture into a thin wire.

The powder mixture obtained at the end of step (h), can be directly rolled using tube method. In this method, 1100 grade aluminum tube will be filled with powder from step (h). The ends of the tube after being tightly sealed with the powder mixture are cold rolled until a thin tape is obtained. Hot rolling, extrusion and swaging also work very well at the end of step (h).

Annealing the thin tape at about 400°–475° C. for about 2 hours in flowing oxygen followed by cooling at a slow rate of about 1° C./minute improves the utlimate properties.

OBJECTS OF THE INVENTION

It is therefore an object of the present invention to improve the ductility of superconducting $YBa_2Cu_3O_{6+x}$ with transition temperature up to 85-88K.

A further object of the present invention is to utilize specific sequences of rolling, heat treating times and temperatures in conjunction with the use of pure aluminum powder to improve the ductility and superconductivity.

With other objects in view, this invention provides a method for making an improved ceramic superconductor by combining rolling, heat treatment sequence with the addition of pure aluminum powder.

DETAILED DESCRIPTION OF THE INVENTION

The present invention provides a unique method for making devices, such as, thin wires or tapes of superconducting $YBa_2Cu_3O_{6+x}$ ceramic material. One specific example of the invention provides a method for improving the ductility of the superconducting ceramic powder with aluminum addition. It is observed that using rolling or heat treatment sequence without aluminum addition or using the aluminum additions without the heat treating sequence will not yield the improvement.

The $YBa_2Cu_3O_{6+x}$ superconductor example is made by mixing yttrium oxide, barium carbonate and copper oxide in a preferable ratio of 100 gm of $Y_2O_3$ to 200 gm $BaCO_3$ to 300 gms of CuO. Other ratios such as 100 gm $Y_2O_3$ to 340 gm $BaCO_3$ to 210 gm CuO also work well; however, the quality is not as good as the former recipe. The mixture of these three (3) compounds is then ball milled with zironia balls for at least one hour. The mixture, after ball milling, is calcined at 940° C. + −2° C. with a specific heating sequence of 3° C. per minute. The mixture is maintained at 940° C. for 300-600 minutes (depending upon the total amount to be reacted. If powder is spread on a sheet and expose more surface, the total time for reaction will be about 300 minutes). The calcined powder is cooled at the rate of 3° C. per minute to the room temperature and is ground into fine powder using zirconia balls. Aluminum powder in the ratio 60 gm aluminum to 40 gm $YBa_2Cu_3O_{6+x}$ was mixed thoroughly in a ball mill using zirconia or alumina balls for at least one hour. Two different proceeding methods can be utilized depending upon the application.

Process 1

The 60 wt. % aluminum and 40 wt. % $YBa_2Cu_3O_{6+x}$ is dry pressed under 25000 psi into a cylinder or bar. The cold pressed bar or rod is heated in a press maintained under a pressure of 25000 psi to about 350°–400° C. for one hour. The sample is cooled and the pressed material is used for hot rolling into a fine tape or wire.

Process 2

The 60 wt. % aluminum and 40 wt. % $YBa_2Cu_3O_{6+x}$ mixture is introduced into an aluminum tube. The two open ends of the tube after being tightly sealed is cold rolled to produce tape of desired thickness (tapes thinner than 10 mils can be rolled very easily). The aluminum tube containing the above mentioned powder can be swaged very easily in order to obtain wire of less than 1 mm in diameter. Other forming processes such as hot rolling, hot extrusion will also work well.

Rolled tapes or wires obtained from the above two process are then annealed in flowing oxygen at about 425°–475° C. for about 2 hours. This annealing process not only relieves the strain in the tapes or wires but also improves the oxygen stoichiometry of $YBa_2Cu_3O_{6+x}$. Annealing above 500° C. degrades the electrical properties of the tape or wire.

The advantages and new features of the invention are that combining the rolling or swaging or extrusion and annealing procedures with the addition of pure aluminum powder at the given composition to the $YBa_2Cu_3O_{6+x}$ superconductor results in a superconductor that has substantially the same or slightly higher superconducting transition temperature. In addition it also shows considerably low resistance up to much higher temperatures. The material is very ductile, as a result, it is very easy to form or machine into the required shape. The improved properties of the new superconductor improves the reliability of any wire, tape or electric device or other product made thereof.

What is claimed is:

1. A method for making an improved ceramic superconductor $YBa_2Cu_3O_{6+x}$ comprising:
   a) mixing a yttrium oxide with barium carbonate and copper oxide in the ratio of about 50 to about 100 gm of $Y_2O_3$, about 175 to about 200 gm of $BaCO_3$ and about 105 to about 300 gm of CuO
   b) ball milling the mixture with zirconia balls for at least one hour;
   c) calcining the mixture at 940° C. + or −2° C. with a heating sequence of about 3° C. to about 5° C. per minute;
   d) maintaining the temperature at 940° C. + or −2° C. for about 300 to about 600 minutes to ensure complete reaction of the mixture;
   e) cooling the mixture to room temperature at the rate of about 3° C. to about 5° per minute;
   f) grinding the mixture into a fine size powder using zirconia balls,
   g) heating the powder to about 700° C. at the rate of about 5° C. per minute and cooling the mixture to 550°–600° C. for 300 minutes in a flowing oxygen environment;
   h) annealing the mixture at 550°–600° C. for 300 minutes in a flowing oxygen environment;
   i) cooling the mixture to room temperature at the rate of about 1° C. per minute;
   j) adding pure aluminum powder to the fine $YBa_2Cu_3O_{6+x}$ in the ratio 60 gm of Al to 40 gm of $YBa_2Cu_3O_{6+x}$;
   k) ball milling the mixture for about one hour using zirconia balls;
   l) dry pressing the powder mixture at about 25,000 psi;
   m) heating the powder mixture at from about 375°–400° C. for about 1 hour;
   n) cooling the powder mixture, and
   o) rolling the powder mixture into a thin ceramic superconductor.

2. A method for making an improved ceramic superconductor as in claim 1 wherein the aluminum powder is added to the mixture of $YBa_2Cu_3O_{6+x}$ in a soft 1100 grade aluminum tube, plugging both ends of the tube and rolling at about 350° C. + or −10° C.

3. A method for making an improved ceramic superconductor as in claim 2 wherein the mixture annealing is carried out at about 425° C. to about 475° C. in flowing oxygen for about 60 to about 120 minutes.

* * * * *